(12) United States Patent
Lee et al.

(10) Patent No.: US 10,344,933 B2
(45) Date of Patent: Jul. 9, 2019

(54) LIGHT-EMITTING DEVICE PACKAGE AND VEHICULAR LIGHT COMPRISING SAME

(71) Applicant: LG INNOTEK CO., LTD., Seoul (KR)

(72) Inventors: Kang Suk Lee, Seoul (KR); Nam Seok Oh, Seoul (KR); Young Jun Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/577,276

(22) PCT Filed: May 27, 2016

(86) PCT No.: PCT/KR2016/005643
§ 371 (c)(1),
(2) Date: Nov. 27, 2017

(87) PCT Pub. No.: WO2016/190706
PCT Pub. Date: Dec. 1, 2016

(65) Prior Publication Data
US 2018/0156407 A1 Jun. 7, 2018

(30) Foreign Application Priority Data
May 28, 2015 (KR) .................. 10-2015-0074561

(51) Int. Cl.
*F21S 41/19* (2018.01)
*F21S 43/00* (2018.01)
(Continued)

(52) U.S. Cl.
CPC .......... *F21S 41/192* (2018.01); *F21S 41/141* (2018.01); *F21S 41/285* (2018.01); *F21S 43/00* (2018.01);
(Continued)

(58) Field of Classification Search
CPC ...... F21S 41/192; F21S 41/141; F21S 41/285; F21S 43/26; F21S 43/15; F21S 43/195;
(Continued)

(56) References Cited

U.S. PATENT DOCUMENTS 6,299,337 B1 * 10/2001 Bachl .................. H01L 25/13
362/545
8,541,947 B2 9/2013 Hodgson et al.
(Continued)

FOREIGN PATENT DOCUMENTS

| EP | 2615358 A2 | 7/2013 |
| EP | 2670218 A1 | 12/2013 |

(Continued)

OTHER PUBLICATIONS

Extended European Search Report dated Feb. 19, 2018 in European Application No. 16800345.7.
(Continued)

*Primary Examiner* — David V Bruce
(74) *Attorney, Agent, or Firm* — Saliwanchik, Lloyd & Eisenschenk

(57) ABSTRACT

According to an embodiment, a light emitting device package includes: a thermally-conductive substrate having at least two mounting regions on which chips are mounted and at least one bending region; a light emitting device module including a light emitting device arranged on one surface of the mounting region; and a driving device module including a driving unit arranged on the other surface opposite to the one surface of the mounting region.

14 Claims, 9 Drawing Sheets

(51) Int. Cl.
*F21S 43/14* (2018.01)
*F21S 45/47* (2018.01)
*H05B 33/08* (2006.01)
*F21S 43/19* (2018.01)
*F21S 43/15* (2018.01)
*F21V 29/89* (2015.01)
*F21S 41/141* (2018.01)
*F21S 41/20* (2018.01)
*F21S 43/20* (2018.01)
*H05K 1/18* (2006.01)
*F21Y 115/10* (2016.01)

(52) U.S. Cl.
CPC ............... *F21S 43/14* (2018.01); *F21S 43/15* (2018.01); *F21S 43/19* (2018.01); *F21S 43/195* (2018.01); *F21S 43/26* (2018.01); *F21S 45/47* (2018.01); *F21V 29/89* (2015.01); *H05B 33/0803* (2013.01); *H05B 33/0842* (2013.01); *F21Y 2115/10* (2016.08); *H05B 33/089* (2013.01); *H05B 33/0812* (2013.01); *H05B 33/0815* (2013.01); *H05K 1/189* (2013.01)

(58) Field of Classification Search
CPC .. F21S 43/19; F21S 43/00; F21S 43/14; F21S 45/47; H05B 33/0815; H05B 33/0842; H05B 33/0812; H05B 33/089; H05B 33/0803; F21V 29/89; F21Y 2115/10; H05K 1/189

See application file for complete search history.

(56) References Cited

U.S. PATENT DOCUMENTS

| | | |
|---|---|---|
| 2004/0164685 A1 | 8/2004 | Dygert |
| 2008/0129204 A1 | 6/2008 | Tsukamoto et al. |
| 2013/0188369 A1 | 7/2013 | Chien et al. |
| 2013/0320850 A1 | 12/2013 | Nakamura |
| 2014/0001969 A1 | 1/2014 | Tateishi et al. |
| 2014/0063805 A1 | 3/2014 | Song et al. |
| 2015/0003083 A1* | 1/2015 | Uehara ............... H05K 1/056 362/418 |

FOREIGN PATENT DOCUMENTS

| | | |
|---|---|---|
| GB | 2398682 A | 8/2004 |
| JP | 2008-176996 A | 7/2008 |

OTHER PUBLICATIONS

International Search Report in International Application No. PCT/KR2016/005643, filed May 27, 2016.

* cited by examiner

[Fig. 1]
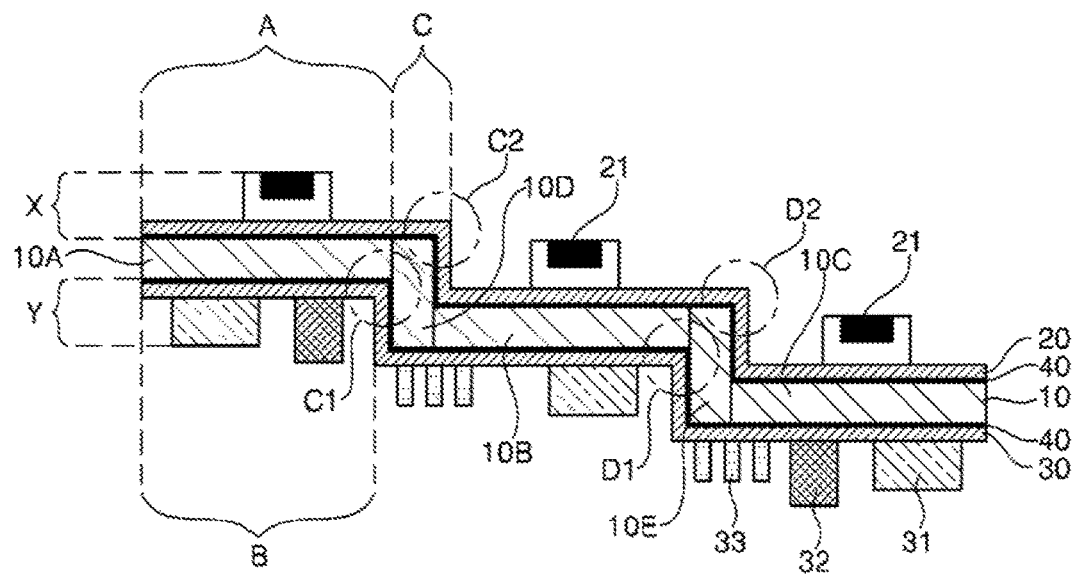
[Fig. 2]
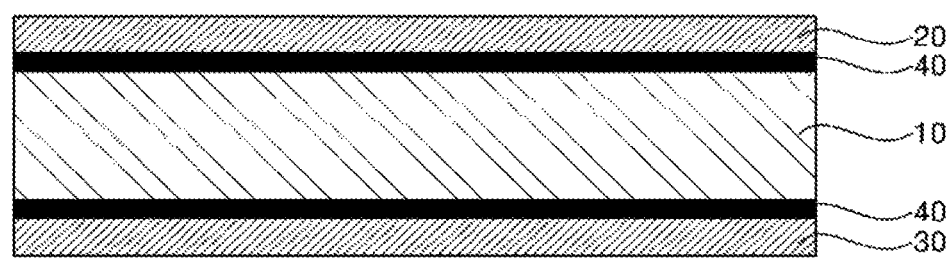

[Fig. 3]
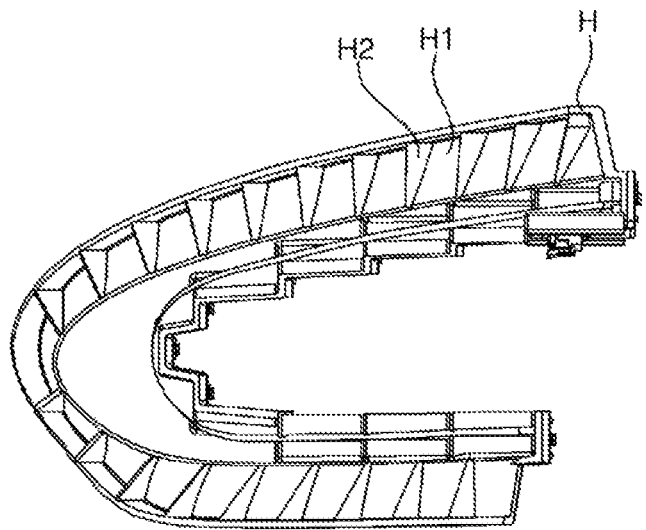
[Fig. 4]
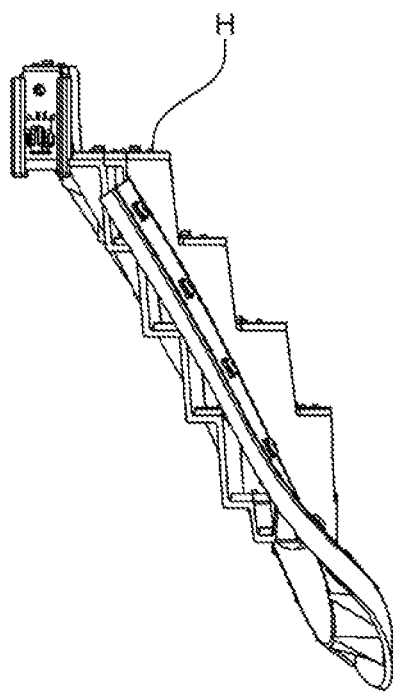

[Fig. 5]
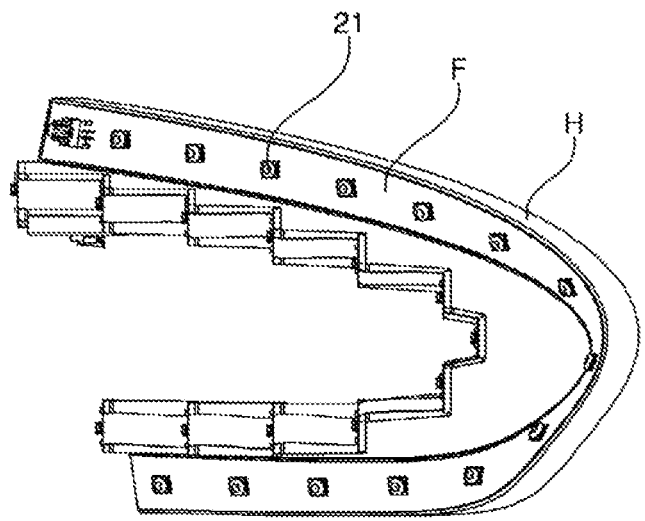
[Fig. 6]
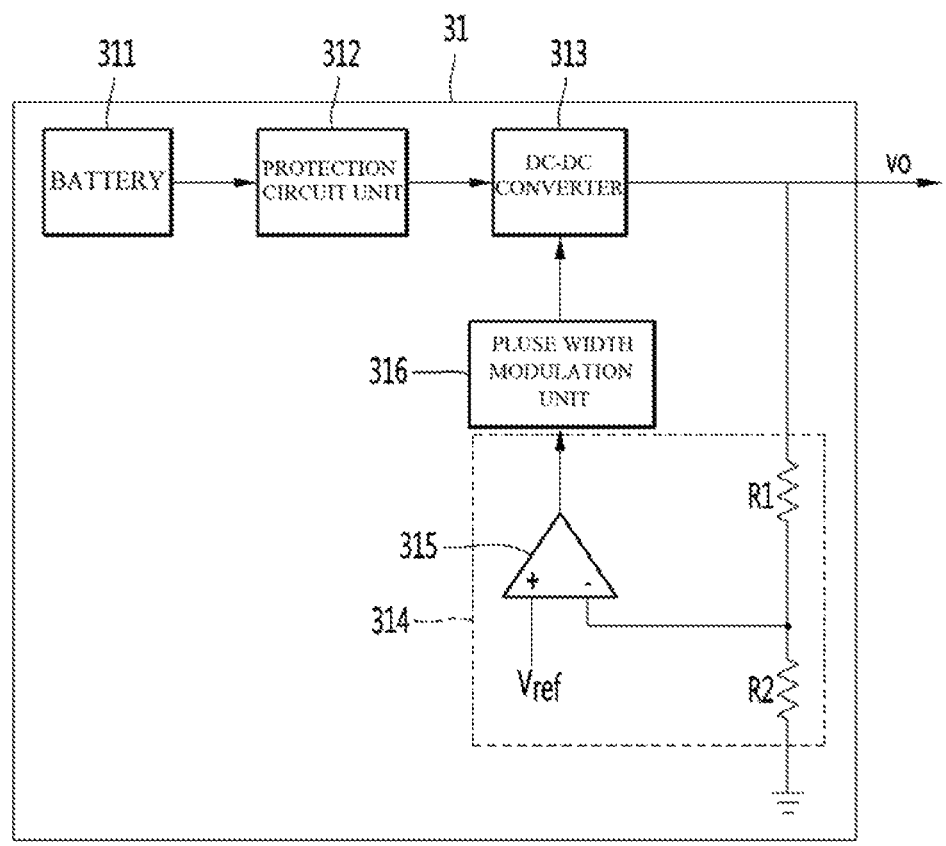

[Fig. 7]
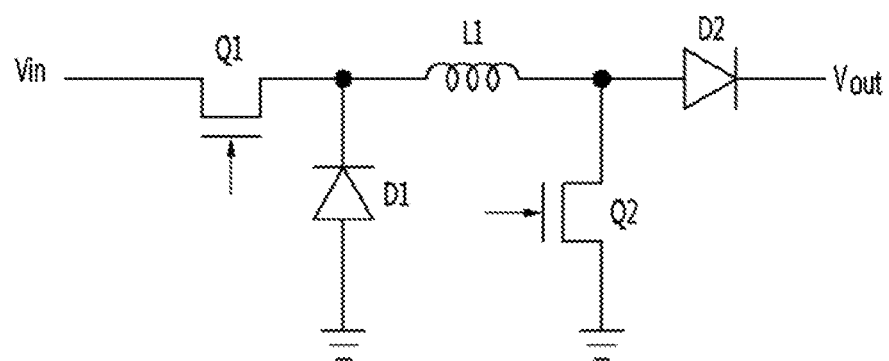
[Fig. 8]
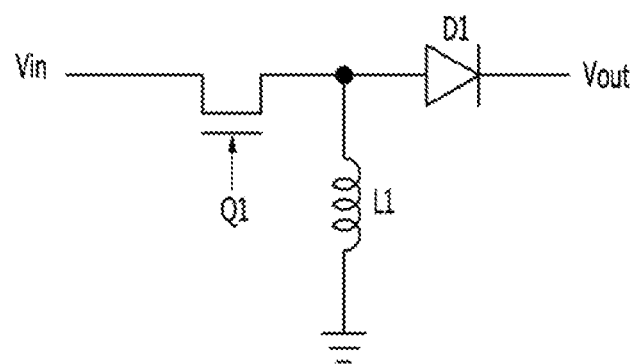

[Fig. 9]
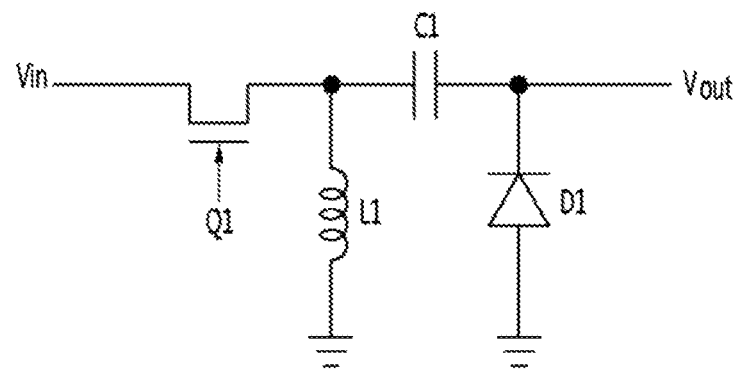
[Fig. 10]
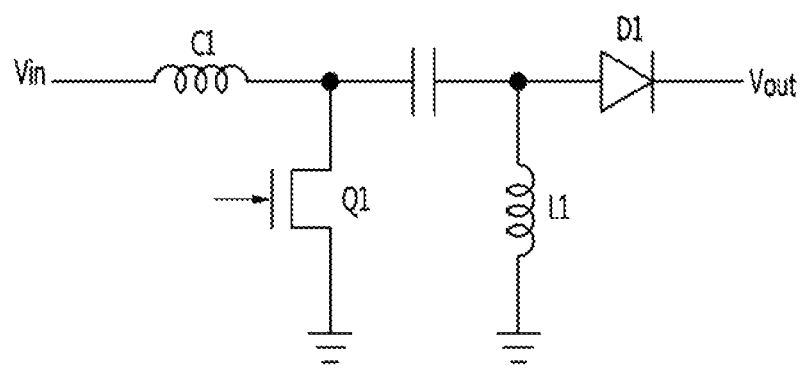

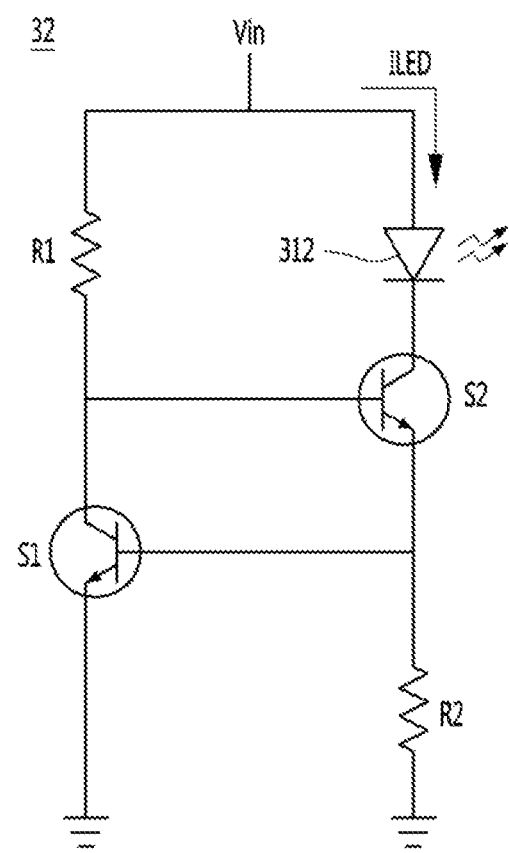
[Fig. 11]

[Fig. 12]
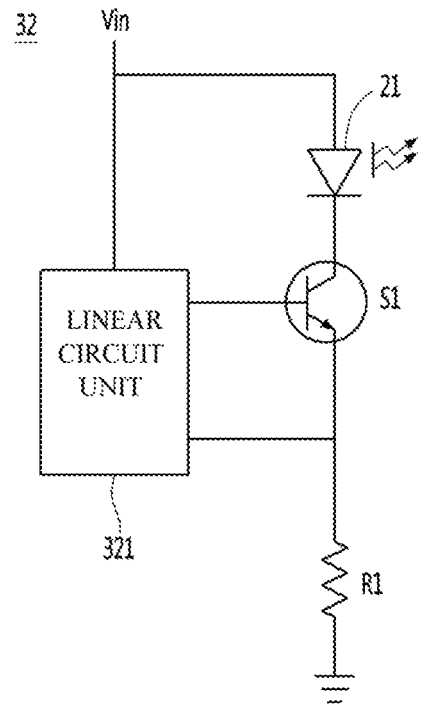
[Fig. 13]
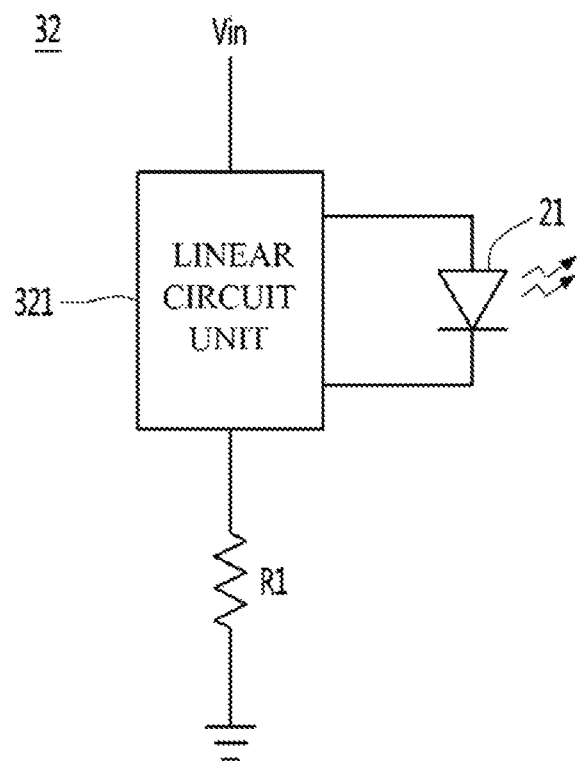

[Fig. 14]
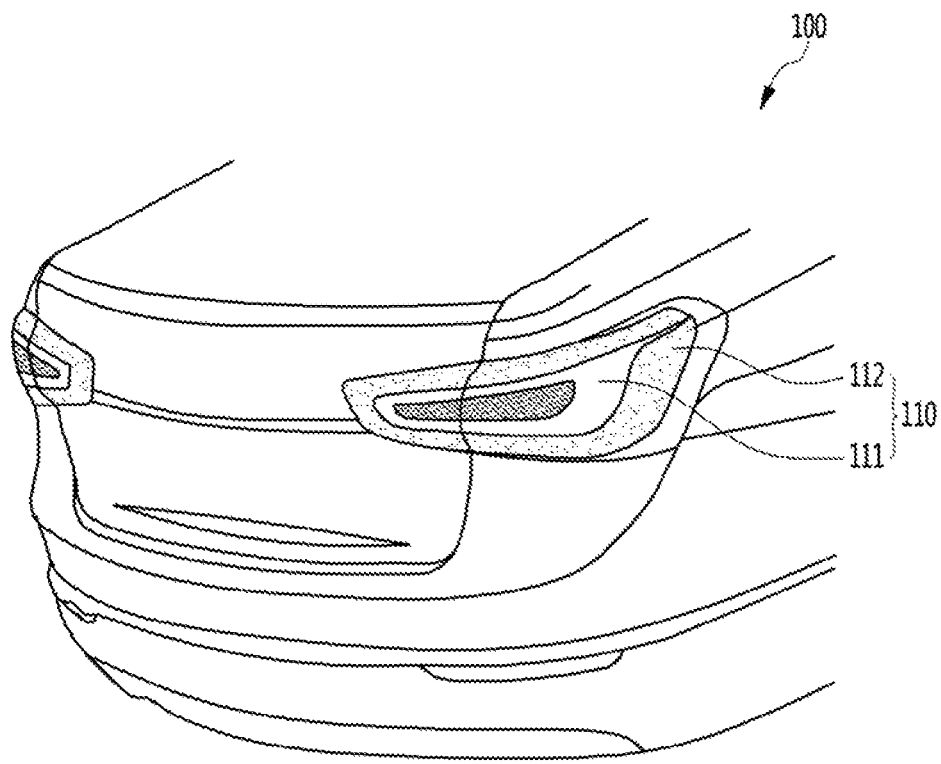
[Fig. 15]
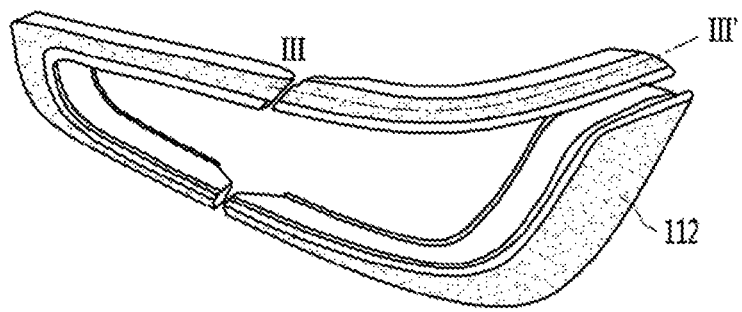

[Fig. 16]
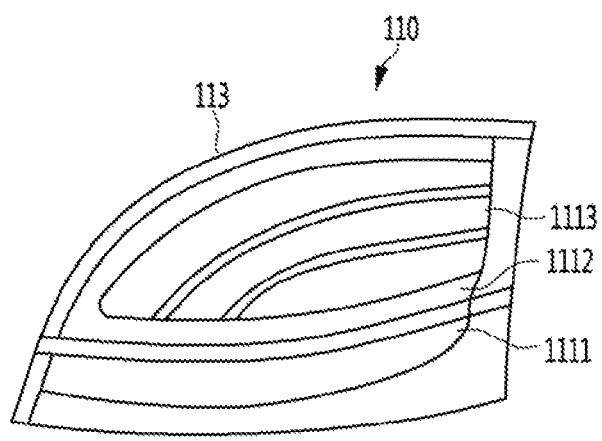

LIGHT-EMITTING DEVICE PACKAGE AND VEHICULAR LIGHT COMPRISING SAME

CROSS-REFERENCE TO RELATED APPLICATIONS

This application is the U.S. national stage application of International Patent Application No. PCT/KR2016/005643, filed May 27, 2016, which claims priority to Korean Application No. 10-2015-0074561, filed May 28, 2015, the disclosures of each of which are incorporated herein by reference in their entirety.

TECHNICAL FIELD

An embodiment of the present invention relates to a light emitting device package, and more particularly, to a light emitting device package capable of securing a degree of design freedom of a printed circuit board while promoting a heat dissipation characteristic and a vehicle light including the same.

BACKGROUND ART

In general, a light emitting diode (hereinafter referred to as LED) is basically composed of a junction of a p-type and an n-type semiconductor. In addition, the LED is a kind of photoelectronic device that emits energy corresponding to a bandgap of a semiconductor in a form of light by the combination of electrons and holes as a voltage is applied.

This LED is widely used in a range of applications such as a high luminance light source for flash, a backlight for a liquid crystal display (LCD) used in a portable electronic product such as a mobile phone, a camcorder, a digital camera, and a PDA, a light source for a electronic signboard, a light source of switch illuminating and lighting, a light source of an indicator and traffic lights.

This LED is developed as a Surface Mount Device (SMD) type that is mounted using Surface Mount Technology (SMT) according to a trend of miniaturization, slimness or the like of an information communication device.

However, in the case of a printed circuit board on which an LED is mounted, a size of the printed circuit board is increased in consideration of a driving device necessary for driving the LED and the LED's own heat dissipation characteristic, which leads to a limitation in a module's own miniaturization. In addition, a structure of a heat sink for dissipating heat from a device having a large amount of heat such as an LED is essentially arranged, which causes a problem for the trend of miniaturization described above.

DISCLOSURE

Technical Problem

An embodiment of the present invention provides a light emitting device package including a light emitting device and a driving device mounted on opposite sides of a heat sink with the heat sink interposed therebetween, and a vehicle light including the light emitting device package.

In addition, an embodiment of the present invention also provides a light emitting device package that may realize reliability and thinning of a junction even in a bending structure of a thermally-conductive substrate having a bending structure and a vehicle light including the same.

Technical problems to be solved by the embodiments proposed herein are not limited to those mentioned above, and other unmentioned technical aspects should be clearly understood by one of ordinary skill in the art to which the embodiments proposed herein pertain from the description below.

Technical Solution

According to an embodiment, a light emitting device package includes: a thermally-conductive substrate having at least two mounting regions on which chips are mounted and at least one bending region; a light emitting device module including a light emitting device arranged on one surface of the mounting region; and a driving device module including a driving unit arranged on the other surface opposite to the one surface of the mounting region.

In addition, according to an embodiment of the present invention, a vehicle light includes a lens housing; and a light emitting device package arranged in the lens housing, wherein the light emitting device package includes: a thermally-conductive substrate having at least two mounting regions on which chips are mounted and at least one bending region; a light emitting device module including a light emitting device arranged on one surface of the mounting region; and a driving device module including a driving unit arranged on the other surface opposite to the one surface of the mounting region.

Advantageous Effects

According to an embodiment of the present invention, an integrated module in which a module in which a light emitting device and a driving device are mounted on an upper portion and a lower portion of a thermally-conductive substrate is pressed by an autoclave, thereby improving a degree of spatial freedom of a structure.

In addition, according to an embodiment of the present invention, a light emitting device package capable of realizing bonding reliability and thinning may be implemented in a bending structure of a thermally-conductive substrate having a bending structure, thereby overcoming a space limitation.

Further, according to an embodiment of the present invention, an autoclave method may be applied based on a flexible printed circuit board having ductility of a film material, thereby remarkably reducing a thickness of a adhesive layer and maximizing reliability of adhesion.

Furthermore, according to an embodiment of the present invention, a heat sink may be directly attached between an LED array module and an LED drive module, thereby increasing a heat dissipation characteristic.

DESCRIPTION OF DRAWINGS

FIG. 1 is a cross-sectional view schematically illustrating a light emitting device package according to an embodiment of the present invention.

FIG. 2 is a schematic cross-sectional view of enlarging a main part of FIG. 1.

FIGS. 3 to 5 are views illustrating one application example of applying a light emitting device package to a vehicle light according to an embodiment of the present invention.

FIG. 6 is a detailed circuit diagram of a first driving unit shown in FIG. 1.

FIG. 7 is a first configuration example of a DC-DC converter 313 shown in FIG. 6.

FIG. 8 is a second configuration example of the DC-DC converter 313 shown in FIG. 6.

FIG. 9 is a third configuration example of the DC-DC converter 313 shown in FIG. 6.

FIG. 10 is a fourth configuration example of the DC-DC converter 313 shown in FIG. 6.

FIG. 11 is a first configuration example of a second driving unit shown in FIG. 1.

FIG. 12 is a second configuration example of the second driving unit shown in FIG. 1.

FIG. 13 is a third configuration example of the second driving unit shown in FIG. 1.

FIGS. 14 to 16 are diagrams illustrating a vehicle light according to an embodiment of the present invention.

MODES OF THE INVENTION

Hereinafter, a configuration and an operation according to the present invention will be described in detail with reference to accompanying drawings. In the following description with reference to the accompanying drawings, the same reference numerals denote the same components regardless of the reference numerals, and a duplicate description thereof will be omitted. The terms first, second, and the like may be used to describe various components, but the components should not be limited by the terms. The terms are used only for the purpose of distinguishing one component from another.

FIG. 1 is a cross-sectional view schematically illustrating a light emitting device package according to an embodiment of the present invention. FIG. 2 is a cross-sectional view of a main part of FIG. 1.

Referring to FIGS. 1 and 2, according to an embodiment of the present invention, a light emitting device package may be configured to include a light emitting device module X including a thermally-conductive substrate 10 having at least two or more mounting regions A:10A, 10B, and 10C on which chips are mounted and at least one or more of bending regions of C:10D and 10E, and a light emitting device 21 arranged on one surface of the mounting region, and a driving device module Y including driving units 31, 32, and 33 arranged on the other surface opposite to the one surface of the mounting region.

In particular, according to the embodiment of the present invention, the light emitting device package may realize a bending type structure by expanding from a flat type. As shown in FIG. 1, the mounting regions A constituting the flat type region may exist in a large number, and the bending regions C extending from terminals of the mounting region A may also exist in a large number. The light emitting device package having such a structure above not only may mount a large number of light emitting devices in a limited space, but also may realize an advantage capable of maximizing a degree of design freedom by slimming a thickness of the package.

The light emitting device module X may be configured to include a light emitting device 21 configured to emitting light and a first substrate 20 on which the light emitting device 21 is mounted. In this case, the first substrate 20 may be disposed on a surface of the thermally-conductive substrate 10 with an adhesive insulating layer 40 as a medium via the mounting region and the bending region.

A problem of a structure having such a bending structure is that when a substrate or an adhesive layer is bent and bonded at bending points C1, C2, D1, and D2 as shown in FIG. 1, in this part, there is a problem that the adhesion is not performed well or the substrate is broken. Accordingly, according to an embodiment of the present invention, a flexible printed circuit board based on a polyimide film having flexibility may be applied to the substrate. Furthermore, in the case of an adhesive insulating layer, unlike a conventional technique of increasing a thickness of the adhesive insulating layer in order to secure adhesion reliability of a bending point, it is possible to realize the adhesive layer very thinly using an autoclave method.

In detail, the first substrate 20 may be disposed in a structure insulated from the thermally-conductive substrate 10, and in particular, may be disposed in a structure in which one surface of the first substrate 20 is in contact with the thermally-conductive substrate 10. In this case, the adhesive insulating layer 40 may be disposed between a surface of the thermally-conductive substrate 10 which is in contact with one surface of the first substrate 20 and the one surface of the first substrate 20.

In addition, one of a resin-based printed circuit board (PCB), a metal core PCB, a flexible PCB, a ceramic PCB, and an FR-4 substrate may be applied to the first substrate 20. In one example of the present invention, a flexible PCB may be applied in order to promote bending in a bent portion, efficiency of design, and adhesion reliability.

In addition, the light emitting device 21 is configured to include a light emitting diode that emits light, and is a concept including various light sources. For example, a solid light emitting device may be applied. One selected from an LED, an OLED, a laser diode (LD), a laser, and a VCSEL may be applied to the solid light emitting device. In one embodiment of the present invention, an LED used as a light emitting device will be described below as an example. Therefore, an LED array module (LAM) implemented by mounting a large number of light emitting devices of the present invention on a flexible PCB (first substrate) may be arranged along a surface of a thermally-conductive substrate.

In addition, the first substrate 20 may mount a large number of light emitting devices 21 to form an LED array module (LAM), and the first substrate 20 may expose a large number of electrode lines so that the light emitting device 21 such as an LED can be mounted on and thus electrically connected to the first substrate 20.

In addition, the light emitting device 21 may be configured to be mounted on a through hole of the first substrate 20 so as to be connected to an electrode line and a reflective member having a radial reflector on one side may be integrated and fixed with an epoxy resin.

In addition, the driving device module Y may be configured to be arranged on the other surface of the thermally-conductive substrate, and may be configured to include a second substrate 30 including driving units 31, 32, and 33 electrically connected to the light emitting device module. Furthermore, an adhesive insulating layer 40 may be arranged between the second substrate 30 and the thermally-conductive substrate 10. When a light emitting device is an LED, the driving device module may be implemented as an LED drive module (LDM).

The driving unit includes a first driving unit 31, a second driving unit 32 and other devices 33. In this case, one of a resin-based printed circuit board (PCB), a metal core PCB, a flexible PCB, a ceramic PCB, and an FR-4 substrate may be applied to the second substrate 30.

The second substrate 30 mounts the first driving unit 31 and the second driving unit 32 thereon to form an LED drive module (LDM) capable of driving an LED.

The second substrate 30 includes a large number of through holes similar to the first substrate 20, and thus the first driving unit 31 and the second driving unit 32 can be mounted through the through holes.

In addition, the first substrate 20 and the second substrate 30 may be configured to include through holes including a via hole for mounting a chip, a via hole for electrical connection of each layer, a thermal via hole for facilitating thermal diffusion, and the like.

The thermally-conductive substrate 10 may perform a function of a heat sink for accommodating heat generated from the light emitting device 21 and discharging the heat to the outside, and simultaneously, may implement a function of a supporting unit for supporting each of printed circuit boards for mounting a light emitting device and a driving unit. Therefore, thermally conductive plastic may be applied to the thermally-conductive substrate 10. For example, the thermally-conductive substrate 10 may be implemented with a plastic substrate such as a PC, or a resin material having excellent an electrical insulation property, heat resistance, and lifetime, such as a thermally-conductive acrylic interface elastomer.

Alternatively, unlike this, a metal substrate having an excellent thermal conductivity may be applied to the thermally-conductive substrate 10. As an example of this, a substrate to which a material such as Al or Al-containing alloy is applied may be applied. In the case where the thermally-conductive substrate 10 is formed of aluminum or an alloy thereof, the thermally-conductive substrate 10 may be manufactured by extruding the thermally-conductive substrate 10 in a form of a thin plate and then pressing the thermally-conductive substrate 10 in order to improve heat dissipation and enhance manufacturing efficiency. When the thermally-conductive substrate 10 is manufactured by the method described above, the thermally-conductive substrate 10 may exhibit high thermal conductivity of about 200 W/mK, thereby maximizing heat dissipation efficiency.

In addition, the thermally-conductive substrate 10 may be formed of a material such as magnesium, beryllium, aluminum, zirconium, thorium, lithium or the like. For example, the thermally-conductive substrate 10 is extrusion-molded from a material having a magnesium content of 90% or more. The remaining 10% content may include various materials such as beryllium, aluminum, zirconium, thorium, and lithium to improve physical properties such as heat resistance and oxidation resistance.

Furthermore, in an embodiment of the present invention, the first substrate and the second substrate may be implemented to be thinner than the thermally-conductive substrate. For this, a thickness of the thermally-conductive substrate having a heat sink function is increased in order to increase a heat dissipation characteristic in the same space, and simultaneously, in order to maximize a width of the thermally-conductive substrate that functions as a heat sink, a PCB layer is implemented as a very thin flexible PCB based on a polyimide film, thereby maximizing the heat radiation characteristic.

In addition, referring to FIG. 1, the first substrate 20 and the second substrate 30 are arranged at mutually corresponding positions on the one surface and the other surface of the thermally-conductive substrate 10, and a driving device is mounted on the opposite surface of a mounting region where a light emitting device is mounted and the first substrate 20 and the second substrate 30 are arranged symmetrically with each other, and thus it is possible to prevent a local bending phenomenon occurring according to an expansion ratio of the thermally-conductive substrate due to an expansion by to an external heat source.

In particular, in an embodiment of the present invention, a pressing method using an autoclave is applied to the thermally-conductive substrate 10 in a bonding method of the adhesive insulating layer 40 and the first and second substrates.

A method of bonding a PCB to the thermally-conductive substrate 10 performing a heat sink function may be a method simply using an adhesive or a method using a hot stacking method. Simply using an adhesive, a thickness of the adhesive layer should be usually applied to a thickness of 250 μm or more so that the reliability of the bonding may be ensured, but such a thickness of the adhesive layer causes a problem that the thermal resistance which obstructs a heat transfer to the heat sink is increased, and the hot stacking method allows a fine air layer to be formed between a junction interface of the heat sink and the PCB, thereby lowering reliability of the bonding. However, according to the embodiment of the present invention, when the autoclave technique is used, a thickness of an adhesive insulating layer may be remarkably reduced. In general, the thickness of the adhesive insulating layer may be reduced from 250 μm or more to 50 μm or less. In addition, an air layer is hardly generated at the interface between the adhesive insulating layer and the PCB and the thermally-conductive substrate, and thus reliability of bonding can be improved.

In an embodiment of the present invention, the adhesive insulating layer may be formed to a thickness of 50 μm or less. In this case, when the thickness of the adhesive insulating layer exceeds 50 μm, an adhesive property is good, but when an autoclave is pressed, the adhesive insulating layer is pushed to an outer side of the first substrate or the second substrate, and the appearance is damaged, and thus there is a problem that a surface of the thermally-conductive substrate is covered, and a heat conduction characteristic is deteriorated.

In addition, the adhesive insulating layer serves as an insulating layer, thereby preventing an electrical short between the LED array module or the LED drive module and the thermally-conductive substrate.

As shown below, Table 1 represents a thickness of each layer when the adhesive insulating layer and the first substrate are bonded together on the thermally-conductive substrate in the structure of FIG. 2 by using only the adhesive insulating layer, and Table 2 compares an implementation with the autoclave technique according to an embodiment of the present invention.

TABLE 1

| Adhesion Method | Layer | Material | Thickness (mm) |
|---|---|---|---|
| Adhesive Application | FPCB (first substrate) | PI | 0.13 |
| | Adhesive (adhesive insulation layer) | — | 0.25 |
| | Thermally Conductive Substrate | AL | 1.0 |
| | Adhesive (adhesive insulation layer) | — | 0.25 |
| | FPCB (second substrate) | PI | 0.13 |
| | TTL (total thickness) | | 1.76 |

TABLE 2

| Adhesion Method | Layer | Material | Thickness (mm) |
|---|---|---|---|
| Adhesive Application + Autoclave | FPCB (first substrate) | PI | 0.13 |
| | Adhesive (adhesive insulation layer) | — | 0.05 |
| | Thermally Conductive Substrate | AL | 1.0 |
| | Adhesive (adhesive insulation layer) | — | 0.05 |
| | FPCB (second substrate) | PI | 0.13 |
| | TTL (total thickness) | | 1.36 |

Comparing Table 1 and Table 2 above, when the autoclave method according to the present invention is applied together, it can be seen that the thickness of the existing adhesive insulating layer may be reduced to about ⅕ or less from 250 μm to 50 μm.

Further, even if the same thickness of the other existing components is taken, it can be seen that the thickness reduction effect of about 23% is realized compared to the total thickness. Accordingly, the thickness of the adhesive insulating layer may be reduced so as to reduce thermal resistance, and the effect of thermal resistance reduction may be maximized by applying the FPCB to the own PCB.

FIGS. 3 to 5 illustrate an example of applying a light emitting device package according to an embodiment of the present invention to a vehicle light.

FIG. 3 is a perspective view of a structure of a lamp housing H arranged at a headlight or a tail light of a vehicle, and FIG. 4 is a side view of FIG. 3. A lamp housing of a vehicle is limited to a very restricted space in which the lamp of the vehicle is present so that a light emitting device mounting region is designed to have a stepped shape (H1 to H2) as shown in the figure for arranging a large number of light emitting devices in a limited space. In this arrangement structure, a large number of module structures for disposing a PCB on which LEDs are mounted on one surface of the step and mounting a separate heat sink should necessarily be provided. Accordingly, since the area of the entire light emitting package increases in a very large volume in the related art, installation becomes impossible.

However, in the case of the light emitting device package according to an embodiment of the present invention, the thermally-conductive substrate is used as a heat sink, and the LED and the driving device are mounted on an upper and a lower portion of the thermally conductive substrate, thereby minimizing the entire thickness and the package size and applying to such a structure.

That is, when the light emitting device package of the present invention described above with reference to FIG. 1 is mounted on a surface of the stepped structure of FIG. 3, the vehicle lamp may be realized with a very slim and simple structure, and even when an external lens F is coupled as shown in FIG. 5, there is almost no change in the size thereof. As described above, the light emitting device package of the present invention may be applied when an installation place is limited and a large number of design changes are requested such as limited installation places of vehicles such as a headlight of a vehicle, a tail light, and a lamp of construction equipment, and an indoor light in limited spaces or the like.

Hereinafter, the first driving unit 31 and the second driving unit 32 constituting the LED drive module will be described in detail.

Here, the first driving unit 31 may be a constant voltage control circuit for constant voltage control, and the second driving unit 32 may be a constant current control circuit for constant current control.

FIG. 6 is a detailed circuit diagram of a first driving unit shown in FIG. 1.

Referring to FIG. 6, the first driving unit 31 includes a battery 311, a protection circuit unit 312, a DC-DC converter 313, a feedback unit 314, and a pulse width modulation unit 316.

The battery 311 may supply input power for driving the LED array module to the first driving unit 31.

At this point, the battery 311 is an example of a power supply means for supplying the input power, which may be replaced by another means.

In addition, although the battery 311 is included in the first driving unit 31 in the drawing, since the battery 311 is a device for supplying power to the first driving unit 31, it is preferable that the battery 311 be configured separately from the first driving unit 31.

In other words, when the light emitting device package is used in a vehicle lamp, the battery 311 may be a battery of the vehicle, and the first driving unit 31 may be arranged on a substrate distinguished from the battery 311.

The battery 311 may be configured to supply DC power to the DC-DC converter 313, but is not limited thereto. The input power may be included in the range of 9 V to 16 V, but is not limited thereto.

The protection circuit unit 312 is configured to protect an internal configuration of the first driving unit 31 from power input to the battery 311.

Preferably, the protection circuit unit 312 is arranged between the battery 311 and the DC-DC converter 313, and thus it is possible to block, absorb, or bypass to the ground noise or a electromagnetic wave, which is emitted from a device and discharged through a power line.

In addition, the protection circuit unit 312 may further include a reverse voltage prevention circuit for preventing a voltage from flowing in a reverse direction.

The DC-DC converter 313 adjusts the voltage received from the protection circuit unit 312 according to a pulse signal output through the pulse width modulation unit 316 to be described later, and outputs the adjusted voltage to the second driving unit 32.

That is, the DC-DC converter 313 adjusts the voltage received from the protection circuit unit 312 based on a predetermined reference voltage Vref and outputs the adjusted voltage to the second driving unit 32.

At this point, the DC-DC converter 313 may be configured as any one of a buck-boost type converter, a boost type converter, a buck type converter, a buck & boost type converter, a Zeta type converter and a SEPIC type converter or the like.

The pulse width modulation unit 316 is arranged between the DC-DC converter 313 and the feedback unit 314 and generates a pulse signal for adjusting an output voltage Vo of the DC-DC converter 313 based on an output signal of the feedback unit 314, and may control a switching state of a switching device constituting the DC-DC converter 313 according to the generated pulse signal.

The feedback unit 314 may include a comparator 315 and a first resistor R1 and a second resistor R2 connected in series with each other at an output terminal of the DC-DC converter 313.

The first resistor R1 has one terminal connected to the output terminal of the DC-DC converter 313, and the other terminal connected to one terminal of the second resistor R2.

In addition, the second resistor R2 has one terminal connected to the other terminal of the first resistor R1 and the other terminal grounded.

The first resistor R1 and the second resistor R2 are voltage-dividing resistors, and detect and output an output voltage Vo output from the DC-DC converter 313 accordingly.

The comparator 315 is configured as an operational amplifier OP-AMP, a reference voltage Vref is input to the positive terminal of the comparator 315, and a divided voltage is applied to the negative terminal through the first resistor R1 and the second resistor R2.

That is, the feedback unit 314 may output the difference between the reference voltage Vref and the output voltage Vo to the pulse width modulation unit 316 so that an output voltage Vo of the DC-DC converter 313 converges to a predetermined reference voltage Vref. Accordingly, the pulse width modulation unit 316 outputs a pulse signal for compensating an output value of the DC-DC converter 313 based on the difference value, so that an output voltage Vo corresponding to the reference voltage Vref is outputted from the DC-DC converter 313.

Hereinafter, a configuration of the DC-DC converter 313 will be described in detail.

FIG. 7 is a first configuration example of the DC-DC converter 313 shown in FIG. 6, FIG. 8 is a second configuration example of the DC-DC converter 313 shown in FIG. 6, FIG. 9 is a third configuration example of the DC-DC converter 313 shown in FIG. 6, and FIG. 10 is a fourth configuration example of the DC-DC converter 313 shown in FIG. 6.

Referring to FIG. 7, a first switch Q1 is arranged between the protection circuit unit 312 and a first inductor L1 and switches ON/OFF according to a control of the pulse signal received from the pulse width modulation unit 316.

When the first switch Q1 is ON and a second switch Q2 is OFF, the DC-DC converter 313 may flow a current to a load through the first inductor L1.

In addition, when the first switch Q1 is switched to an OFF state, the DC-DC converter 313 may transmit a reverse current due to energy stored in the first inductor L1 to the load and a capacitor C1 according to a direction of a first diode D1. That is, at this point, the DC-DC converter 313 may operate as a buck converter.

In addition, when both of the first switch Q1 and the second switch Q2 are ON, the DC-DC converter 313 may flow a current to only the first inductor L1. When the second switch Q2 is switched to the OFF state, the DC-DC converter 313 may transmit a current due to the energy stored in the first inductor L1 to the load and the capacitor C1 according to a direction of a second diode D2.

The first diode D1 and the second diode D2 prevent a reverse of current that may be transferred from the second driving unit 32 to the DC-DC converter 313. That is, the first diode D1 and the second diode D2 allow a current to flow from the DC-DC converter 313 to the second driving unit 32 only in one direction.

With the above configuration, the DC-DC converter 313 may amplify an input voltage received from the protection circuit unit 312 and output to the second driving unit 32.

Referring to FIG. 8, the DC-DC converter 313 may be a buck-boost type converter. Preferably, the DC-DC converter 313 may include a first switching device Q1, a first diode D1, and a first inductor L1.

Here, the first switching device Q is connected in series with an input power source. At this point, the first switching device Q1 may include a reverse current prevention diode.

The first diode D1 may be connected in series with the first switching device Q1.

In addition, the first inductor L1 may be connected in parallel with the first switching device Q1.

In the DC-DC converter 313 as described above, the first switching device Q is turned ON by the pulse signal supplied during a first period, and accordingly, an input voltage is charged to the first inductor L1 by the TURN-ON of the first switching device Q1.

In the DC-DC converter 313, the first switching device Q1 is turned OFF by the pulse signal supplied during a second period, and accordingly, an inductor voltage charged in the first inductor L1 may be supplied to the second driving unit 32.

In addition, referring to FIG. 9, the DC-DC converter 313 may be a Zeta type converter.

For this, the DC-DC converter 313 may include a first switching device Q1, a first inductor L1, a first capacitor C1, and a first diode D1.

The first switching device Q1 has a drain terminal connected to an output terminal of the protection circuit unit 312, a gate terminal connected to an output terminal of the pulse width modulation unit 316, and a source terminal connected to one terminal of the first inductor and one terminal of the first capacitor.

The first inductor L1 has one terminal connected to the source terminal of the first switching device Q1 and the other terminal grounded.

The first capacitor C1 has one terminal connected to the source terminal of the first switching device Q1 and one terminal of the first inductor L1, and the other terminal connected to an anode terminal of the first diode D1.

The first diode D1 has an anode terminal connected to the other terminal of the first capacitor C1 and an output terminal of the DC-DC converter 313, and a cathode terminal grounded.

Referring to FIG. 10, the DC-DC converter 313 may be a SEPIC type converter. For this, the DC-DC converter 313 may include a first switching device Q, a first inductor L1, a second inductor L2, a first capacitor C1, and a first diode D1.

The first inductor L1 has one terminal connected to an output terminal of the protection circuit unit 312 and the other terminal connected to a drain terminal of the first switching device Q1 and one terminal of the first capacitor C1.

The first switching device Q1 has a drain terminal connected to the other terminal of the first inductor L1 and one terminal of the first capacitor C1, a gate terminal connected to an output terminal of the pulse width modulation unit 316, and a source terminal grounded.

The first capacitor C1 has one terminal connected to the other terminal of the first inductor L1 and the drain terminal of the first switching device Q1, and the other terminal connected to one terminal of the second inductor L2 and a cathode terminal of the first diode D1.

The first diode D1 has a cathode terminal connected to the other terminal of the first capacitor C1 and one terminal of the second inductor L2 and a anode terminal connected to an output terminal of the DC-DC converter 313.

FIG. 11 is a first configuration example of a second driving unit shown in FIG. 1, FIG. 12 is a second configuration example of the second driving unit shown in FIG. 1, and FIG. 13 is a third configuration example of the second driving unit shown in FIG. 1.

FIGS. 11 to 13 illustrate a second driving unit 32, and the second driving unit 32 is connected to the light emitting device 21 and includes a constant current control circuit for controlling a constant current with respect to the light emitting device 21, wherein the constant current control circuit may be a linear circuit.

Referring to FIG. 11, the second driving unit 32 may include a first resistor R1, a first switching device S1, a second switching device S2, and a second resistor R2.

The first resistor R1 has one terminal connected to a power input terminal Vin, and the other terminal connected to a base terminal of the second switching device S2 and a collector terminal of the first switching device S1.

The first switching device S1 has a collector terminal connected to the other terminal of the first resistor R1 and the base terminal of the second switching device S2, a base terminal connected to an emitter terminal of the second switching device S2 and one terminal of the second resistor (R2), and an emitter terminal grounded.

The second switching device S2 has a collector terminal connected to an output terminal of the light emitting device 21, a base terminal connected to the other terminal of the first resistor R1 and the collector terminal of the first switching device S1, and an emitter terminal connected to a base terminal of the first switching device S and one terminal of the second resistor R2.

The second resistor R2 has one terminal connected to the emitter terminal of the second switching device S2 and the base terminal of the first switching device S1 and the other terminal grounded.

Referring to FIG. 12, the second driving unit 32 includes a linear circuit unit 321, a first switching device S1, and a first resistor R1.

Here, the first switching device S1 and the first resistor R1 correspond to the second switching device S2 and the second resistor R2 in FIG. 11.

In FIG. 12, the second driving unit 32 includes a linear circuit unit.

In addition, referring to FIG. 13, the second driving unit 32 may be configured to be a type including only the linear circuit unit 321 and the first resistor R1.

FIGS. 14 to 16 are diagrams illustrating a vehicle light according to an embodiment of the present invention.

Referring to FIGS. 14 to 16, a vehicle 100 is generally provided with a headlamp unit (not shown) on the front side and a tail lamp unit 110 on the rear side. Hereinafter, the tail lamp unit 110 will be described as an example of the vehicle light of the present invention.

The tail lamp unit 110 of the vehicle 100 may be arranged on a curved surface. In addition, the tail lamp unit 110 includes a plurality of lamps, and allows a driver of another vehicle and/or a pedestrian to recognize information on driving states of the vehicle such as whether the vehicle is braking, whether the vehicle is moving backward, a width of the vehicle, indication of a direction of the vehicle, or the like using light emitting of each lamp. In detail, the tail lamp unit 110 includes the light emitting device package as described above.

Accordingly, the light emitting device module constituting the tail lamp unit 110 is arranged on an upper portion of the thermally-conductive substrate 10, the driving device module is arranged on a lower portion of the thermally-conductive substrate 10, and the light emitting device 21 included in the light emitting device module is driven according to an operating voltage supplied from the driving device module to generate light.

When viewed from a horizontal angle of 45 degrees of a vehicle outer shaft with respect to a center point, the tail lamp unit 110 should have a projected area of about 12.5 square centimeters ($cm^2$) or greater, and the brightness for braking, for example, should be about 40 to 420 candelas (cd) to meet safety standards. Therefore, when the light amount of the tail lamp unit is measured in a light amount measuring direction, a light amount exceeding a reference value should be provided. However, ideas of the present invention is not limited to safety standards and required light quantity for the tail lamp unit 110, and may be applied even when safety standards or required light quantity vary.

In addition, the entire tail lamp unit 110 may have a curved surface, a part of the tail lamp unit 110 may have a curved surface, and the rest of the tail lamp unit 110 may not have a curved surface. Further, a first lamp 111 arranged at a center of the tail lamp unit 110 may not have a curved surface, and a second lamp 112 arranged at an outer periphery may have a curved surface. However, the present invention is not limited thereto, and the first lamp 111 arranged at the center may have a curved surface and the second lamp 112 arranged at the outer periphery may have no curved surface.

FIG. 15 illustrates a lamp having a curved surface arranged on an outer side of a tail lamp unit.

In addition, as shown in FIG. 16, the tail lamp unit 110 for a vehicle may include a first lamp unit 1111, a second lamp unit 1112, a third lamp unit 1113, and a housing 113.

Here, the first lamp unit 1111 may be a light source serving as a turn signal lamp, the second lamp unit 1112 may be a light source for indicating a width of the vehicle, and the third lamp unit 1113 may be a light source serving as a stop lamp, but the present invention is not limited thereto, and the functions may be switched each other.

Furthermore, the housing 113 houses the first to third lamp units 1111, 1112, and 1113, and may be formed of a light-transmitting material.

At this point, the housing 113 may have a curvature according to a design of a vehicle body, and the first to third lamp units 1111, 1112, and 1113 may realize a planar light source capable of bending according to a shape of the housing 113.

As described above, according to an embodiment, a large number of light emitting devices having different placement directions with respect to a predetermined reference direction and a light mixing region in an empty space between the light source and the optical system may be formed, and thus it is possible not only to implement a planar light source with a small number of light sources but also to provide light quantity and light intensity suitable for safety standards of a vehicle lamp, thereby improving the economical efficiency of the lamp unit and a degree of product design freedom.

According to an embodiment of the present invention, the integrated module in which the light emitting device module and the driving device module are mounted on opposite sides of the heat sink with the heat sink therebetween may be provided, thereby improving a degree of spatial freedom of devices.

In addition, according to an embodiment of the present invention, the light emitting device module including the light emitting device and the driving device module including the driving device with the heat sink interposed therebetween may be directly attached, thereby improving a heat dissipation characteristic.

That is, in the case of the light emitting device package according to an embodiment of the present invention, the light emitting device module and the driving device module are directly attached to the heat sink, which is a thermally-conductive substrate, and thus the heat dissipation characteristic is quite excellent. Further, an LED array module and an LED drive module may be integrally implemented on opposite surfaces of one substrate, thereby greatly increasing a degree of design freedom for a substrate having the same area. Furthermore, in the conventional heat sink, a large number of LED chips, ICs, resistance chips, and the like are mounted on an upper surface, and a heat dissipation fin is formed on a bottom surface of the heat sink, which necessarily increases a size of the printed circuit board (PCB). On the other hand, in an embodiment of the present invention, an additional heat dissipation fin is not provided, and an LED array module and an LED drive module are formed on top and bottom surfaces of the heat sink, respectively. Accordingly a problem that a cost of the product increases due to an addition of labor costs has been solved, and the LED array module (LAM) and the LED drive module (LDM) are integrated, and thus the degree of spatial freedom of the device can be increased.

Specific embodiments have been described in the detailed description of the present invention as described above. However, various modifications are possible within the scope of the present invention. The technical ideas of the present invention should not be limited to the embodiments of the present invention but should be determined by the claims and equivalents thereof.

The invention claimed is:

1. A light emitting device package, comprising:
a thermally-conductive substrate including a plurality of mounting regions on which chips are mounted and at least one bending region between the plurality of mounting regions;
a light emitting device module including a light emitting device arranged on one surface of the mounting region of the thermally-conductive substrate;
a driving device module including a driving unit arranged on an other surface opposite to the one surface of the thermally-conductive substrate;
a first adhesive insulating layer disposed between the thermally-conductive substrate and the light emitting device module; and
a second adhesive insulating layer disposed between the thermally-conductive substrate and the driving device module,
wherein the light emitting device module includes a first substrate disposed on the first adhesive insulating layer and a plurality of light emitting devices disposed on the first substrate,
wherein the driving device module includes a second substrate disposed on the second adhesive insulating layer and the driving unit disposed on the second substrate to drive the plurality of light emitting devices, and
wherein the first substrate and the second substrate include a flexible PCB.

2. The light emitting device package of claim 1, wherein the first substrate includes a first region disposed on the plurality of mounting regions on the one surface of the thermally-conductive substrate, and a second region disposed on the bending region of the thermally-conductive substrate, wherein at least one light emitting device is disposed on the first region of the first substrate, and
wherein the second substrate includes a third region disposed on the plurality of mounting regions on the other surface of the thermally-conductive substrate and facing the first region, and a fourth region facing the second region disposed on the bending region of the thermally-conductive substrate, and wherein the driving unit is disposed on the third region.

3. The light emitting device package of claim 2, wherein the first substrate and the second substrate are arranged at mutually corresponding positions on the first and second adhesive insulating layers, respectively, and
wherein the driving device is mounted on an opposite surface of the mounting region where the light emitting device is mounted and the driving device and the light emitting device are arranged symmetrically with each other.

4. The light emitting device package of claim 3, wherein the light emitting device and the driving device are not disposed on the second region and the fourth region.

5. The light emitting device package of claim 4, wherein the first and second substrates are attached on the first and second adhesive insulating layers by an autoclave.

6. The light emitting device package of claim 1, wherein each of the first and the second adhesive insulating layers has a thickness of 50 um or less.

7. The light emitting device package of claim 1, wherein the thermally-conductive substrate includes a metal substrate of aluminum (Al) or an aluminum alloy.

8. The light emitting device package of claim 1, wherein the driving unit includes a first driving unit configured to supply an operating voltage and a second driving unit configured to receive the operating voltage from the first driving unit and output an operating current to the light emitting device module based on the received operating voltage.

9. The light emitting device package of claim 8, wherein the first driving unit includes
a power input unit configured to receive input power, a DC-DC converter including at least one switching device, and configured to convert the input power according to a switching operation of the switching device and output the operating voltage, a feedback unit configured to compare an output voltage of the DC-DC converter with a predetermined reference voltage and output a control value according to the comparison result, and a pulse width modulation unit configured to output a pulse signal to the DC-DC converter using the control value output through the feedback unit.

10. The light emitting device package of claim 9, wherein the feedback unit includes
a voltage-dividing resistor connected to an output terminal of the DC-DC converter, and a comparator configured to compare the voltage output through the voltage-dividing resistor and the reference voltage and output the control value.

11. The light emitting device package of claim 8, wherein the second driving unit includes a linear circuit unit for controlling the operating current.

12. A vehicle light, comprising:
a lens housing; and
a light emitting device package arranged in the lens housing,
wherein the light emitting device package includes
a thermally-conductive substrate including a plurality of mounting regions on which chips are mounted and at least one bending region between the plurality of mounting regions;
a light emitting device module including a light emitting device arranged on one surface of the mounting region of the thermally-conductive substrate;
a driving device module including a driving unit arranged on an other surface opposite to the one surface of the mounting region of the thermally-conductive substrate;

a first adhesive insulating layer disposed between the thermally-conductive substrate and the lighting emitting device module; and
a second adhesive insulating layer disposed between the thermally-conductive substrate and the driving device module,
wherein the light emitting device module includes a first substrate disposed on the first adhesive insulating layer and a plurality of light emitting devices disposed on the first substrate,
wherein the driving device module includes a second substrate disposed on the second adhesive insulating layer and a driving unit disposed on the second substrate and driving the plurality of light emitting devices; and
wherein the first substrate and the second substrate include a flexible PCB.

13. The vehicle light of claim 12, wherein the first substrate includes a first region disposed on the plurality of mounting regions on the one surface of the thermally-conductive substrate, and a second region disposed on the bending region of the thermally-conductive substrate, wherein at least one light emitting device is disposed on the first region of the first substrate, and
wherein the second substrate includes a third region disposed on the plurality of mounting regions on the other surface of the thermally-conductive substrate and facing the first region, and a fourth region facing the second region disposed on the bending region of the thermally-conductive substrate, and the driving unit is disposed on the third region.

14. The vehicle light of claim 13, wherein the first substrate and the second substrate are arranged at mutually corresponding positions on the first and second adhesive insulating layers, respectively,
wherein the driving device is mounted on an opposite surface of the mounting region where the light emitting device is mounted and the driving device and the light emitting device are arranged symmetrically with each other, and
wherein the first and second substrates are attached on the first and second adhesive insulating layers by an autoclave.

\* \* \* \* \*